(12) United States Patent
Behzadi et al.

(10) Patent No.: US 11,366,206 B2
(45) Date of Patent: Jun. 21, 2022

(54) LIDAR APPARATUS WITH AN OPTICAL AMPLIFIER IN THE RETURN PATH

(71) Applicant: Aeva, Inc., Mountain View, CA (US)

(72) Inventors: Behsan Behzadi, Sunnyvale, CA (US); Mina Rezk, Haymarket, VA (US)

(73) Assignee: Aeva, Inc., Mountain View, CA (US)

( * ) Notice: Subject to any disclaimer, the term of this patent is extended or adjusted under 35 U.S.C. 154(b) by 497 days.

(21) Appl. No.: 16/356,927

(22) Filed: Mar. 18, 2019

(65) Prior Publication Data

US 2020/0300993 A1 Sep. 24, 2020

(51) Int. Cl.
| | | |
|---|---|---|
| *G01S 7/4912* | (2020.01) | |
| *G01S 17/34* | (2020.01) | |
| *G01S 7/481* | (2006.01) | |
| *H01S 3/067* | (2006.01) | |
| *H01S 5/50* | (2006.01) | |
| *G01S 17/931* | (2020.01) | |
| *G01S 17/42* | (2006.01) | |

(52) U.S. Cl.
CPC .......... *G01S 7/4918* (2013.01); *G01S 7/4812* (2013.01); *G01S 17/34* (2020.01); *G01S 7/4917* (2013.01); *G01S 17/42* (2013.01); *G01S 17/931* (2020.01); *H01S 3/06754* (2013.01); *H01S 3/06758* (2013.01); *H01S 5/50* (2013.01)

(58) Field of Classification Search
CPC .. H01S 3/06754; H01S 3/06758; G01S 17/32; G01S 17/34; G01S 17/36
See application file for complete search history.

(56) References Cited

U.S. PATENT DOCUMENTS

| 7,986,397 B1* | 7/2011 | Tiemann | G01S 17/89 |
| | | | 356/5.09 |
| 2013/0083389 A1* | 4/2013 | Dakin | G01S 7/484 |
| | | | 359/285 |
| 2015/0308811 A1* | 10/2015 | Feneyrou | G01B 9/02083 |
| | | | 356/4.09 |
| 2019/0072672 A1* | 3/2019 | Yao | G01S 17/931 |
| 2019/0302237 A1* | 10/2019 | Singer | G01S 17/58 |
| 2019/0302262 A1* | 10/2019 | Singer | G01S 7/4818 |
| 2019/0302268 A1* | 10/2019 | Singer | G01S 17/931 |

(Continued)

FOREIGN PATENT DOCUMENTS

EP 3388866 A1 10/2018

OTHER PUBLICATIONS

International Search Report and Written Opinion dated May 13, 2020 for International Application No. PCT/US2020/020664.

*Primary Examiner* — Eric L Bolda
(74) *Attorney, Agent, or Firm* — Womble Bond Dickinson (US) LLP

(57) ABSTRACT

A light detection and ranging (LIDAR) apparatus includes an optical circuit including a laser source configured to emit a laser beam, a beam separator operatively coupled to the laser source, the beam separator configured to separate the laser beam propagated towards a target, a first optical amplifier coupled to the beam separator, the first optical amplifier configured to receive a return laser beam reflected from the target in a return path and amplify the return laser beam to output an amplified return laser beam, and an optical component operatively coupled to the first optical amplifier, the optical component configured to output a current based on the amplified return laser beam.

21 Claims, 4 Drawing Sheets

(56) References Cited

U.S. PATENT DOCUMENTS

| | | | |
|---|---|---|---|
| 2019/0302269 A1* | 10/2019 | Singer | G01S 7/4812 |
| 2019/0331797 A1* | 10/2019 | Singer | G01S 7/4813 |
| 2021/0109218 A1* | 4/2021 | Peters | G01S 17/88 |

* cited by examiner

LIDAR APPARATUS WITH AN OPTICAL AMPLIFIER IN THE RETURN PATH

TECHNICAL FIELD

The present disclosure relates generally to a light detection and ranging (LIDAR) apparatus that provides an improved signal to noise ratio.

BACKGROUND

In an ideal case, typically the number of received photons (light) from a target is increased by sending more optical power (i.e., more photons) out or by enlarging the aperture size in the collection path. However, considering the limitations due to eye-safety of humans and preferences in the size and cost of a LIDAR apparatus, neither of these methods is scalable.

Another way of increasing the signal to noise ratio (SNR) is by using photodetectors with high gain and high responsivity. However, such a detector or sensor (e.g., avalanche photodiodes) may be characterized by low saturation optical power that may result in blinding the LIDAR apparatus when it is detecting reflective objects and therefore decreases the dynamic range of the sensor.

SUMMARY

The present disclosure includes, without limitation, the following example implementations. Some example implementations provide a light detection and ranging (LIDAR) apparatus comprising an optical circuit comprising a laser source configured to emit a laser beam and a beam separator operatively coupled to the laser source in which the beam separator is configured to separate the laser beam propagated towards a target. The optical circuit further comprises a first optical amplifier operatively coupled to the beam separator. The first optical amplifier is configured to receive a return laser beam reflected from the target in a return path and amplify the return laser beam to output an amplified return laser beam. The optical circuit further comprises an optical component operatively coupled to the first optical amplifier in which the optical component is configured to output a current based on the amplified return laser beam.

In accordance with another aspect of the present disclosure, an optical circuit for a light detection and ranging (LIDAR) apparatus comprises a laser source configured to emit a laser beam propagated towards a target and a first optical amplifier operatively coupled to the laser source. The first optical amplifier is configured to receive a return laser beam reflected from the target in a return path and amplify the return laser beam to output an amplified return laser beam. The optical circuit further comprises an optical component operatively coupled to the first optical amplifier in which the optical component is configured to output a current based on the amplified return laser beam and a local oscillator signal.

In accordance with yet another aspect of the present disclosure, a method comprises emitting, by a laser source, a laser beam, receiving, by an optical amplifier, a return laser beam reflected from a target in a return path, amplifying, by the optical amplifier, the return laser beam to output an amplified return laser beam, mixing the amplified return laser beam with a portion of a local oscillator signal, and outputting, by an optical component, a current based on the amplified return laser beam.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects, and advantages will become apparent from the following detailed description taken in conjunction with the accompanying figures which illustrate, by way of example, the principles of some described example implementations.

BRIEF DESCRIPTION OF THE FIGURE(S)

DETAILED DESCRIPTION

Frequency modulated continuous wave (FMCW) light detection and ranging (LIDAR) systems or apparatuses (such as coherent LIDAR systems) coherently mix light with two different delays which results in a beat radio frequency (RF) signal. When a target or object with low reflectivity is far away from a LIDAR system, the reflected target signal from the target received by the LIDAR system may not have sufficient power for the LIDAR system to adequately detect the target. The sensing performance of LIDAR systems is improved when the signal-to-noise ratio (SNR) is increased. For example, if the number of captured photons reflected from the target is increased, the sensed signal increases. The present disclosure describes an active method that coherently amplifies the optical target signal while maintaining a low noise level. This method is robust, integrated optics compatible, and is suitable for mass manufacturing. The present disclosure describes a coherent LIDAR system architecture that takes advantage of coherent amplification of received photons from the target. This method significantly improves the SNR of the beat RF signals, allowing objects with lower reflectivity to be detected at a longer range. Aspects of the present disclosure improve the SNR of a LIDAR system by increasing the number of captured photons without sending more optical power toward the target or enhancing collection aperture/efficiency. In addition, this method is compatible with optical integrated circuits and can be implemented in a small form factor.

Figure 1:
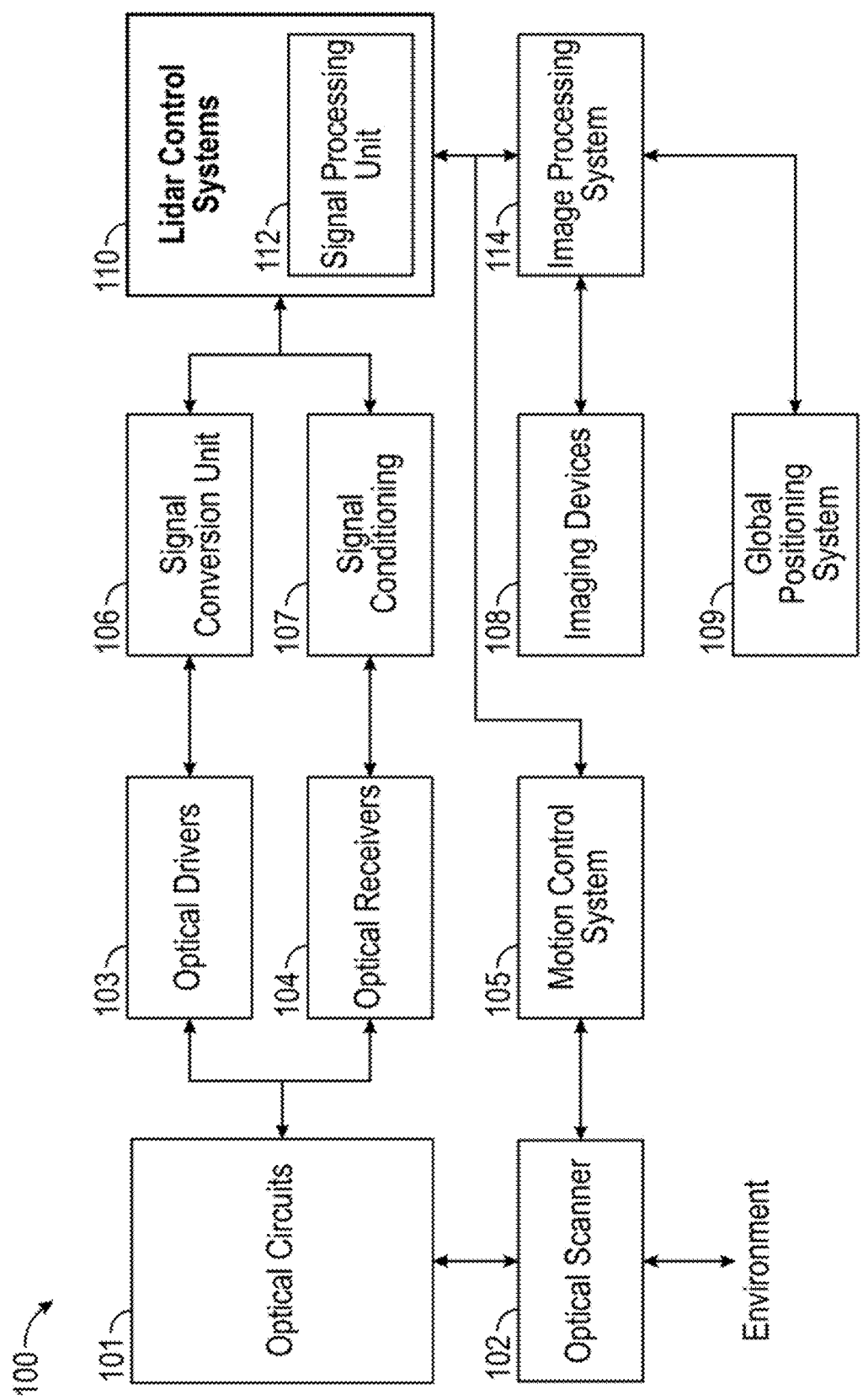
FIG. 1 illustrates a LIDAR apparatus according to example implementations of the present disclosure.

FIG. 1 illustrates a LIDAR apparatus 100 according to example implementations of the present disclosure. The LIDAR apparatus 100 includes one or more of each of a number of components, but may include fewer or additional components than shown in FIG. 1. The LIDAR apparatus 100 may be implemented in any sensing market, such as, but not limited to, transportation, manufacturing, metrology, medical, and security systems. For example, in the automotive industry, the described beam delivery system becomes the front-end of frequency modulated continuous-wave (FMCW) devices that can assist with spatial awareness for automated driver assist systems, or self-driving vehicles. As shown, the LIDAR apparatus 100 includes optical circuits 101. The optical circuits 101 may include a combination of active optical components and passive optical components. Active optical components may generate, amplify, or detect optical signals and the like. In some examples, the active optical circuit includes lasers at different wavelengths, one or more optical amplifiers, one or more optical detectors, or the like.

Passive optical circuits may include one or more optical fibers to carry optical signals, and route and manipulate optical signals to appropriate input/output ports of the active optical circuit. The passive optical circuits may also include one or more fiber components such as taps, wavelength division multiplexers, splitters/combiners, polarization beam splitters, collimators or the like. In some embodiments, as discussed further below, the passive optical circuits may include components to transform the polarization state and direct received polarized light to optical detectors using a PBS.

An optical scanner 102 includes one or more scanning mirrors that are rotatable along respective orthogonal axes to steer optical signals to scan an environment according to a scanning pattern. For instance, the scanning mirrors may be rotatable by one or more galvanometers. The optical scanner 102 also collects light incident upon any objects in the environment into a return laser beam that is returned to the passive optical circuit component of the optical circuits 101. For example, the return laser beam may be directed to an optical detector by a polarization beam splitter. In addition to the mirrors and galvanometers, the optical scanning system may include components such as a quarter-wave plate, lens, anti-reflective coated window or the like.

To control and support the optical circuits 101 and optical scanner 102, the LIDAR apparatus 100 includes a LIDAR control systems 110. The LIDAR control systems 110 may function as a processing device for the LIDAR apparatus 100. In some embodiments, the LIDAR control system 110 may include signal processing 112 such as a digital signal processor. The LIDAR control systems 110 are configured to output digital control signals to control optical drivers 103. In some embodiments, the digital control signals may be converted to analog signals through signal conversion unit 106. For example, the signal conversion unit 106 may include a digital-to-analog converter. The optical drivers 103 may then provide drive signals to active components of optical circuits 101 to drive optical sources such as lasers and amplifiers. In some embodiments, several optical drivers 103 and signal conversion units 106 may be provided to drive multiple optical sources.

The LIDAR control systems 112 are also configured to output digital control signals for the optical scanner 102. A motion control system 105 may control the galvanometers of the optical scanner 102 based on control signals received from the LIDAR control systems 110. For example, a digital-to-analog converter may convert coordinate routing information from the LIDAR control systems 110 to signals interpretable by the galvanometers in the optical scanner 102. In some embodiments, a motion control system 105 may also return information to the LIDAR control systems 110 about the position or operation of components of the optical scanner 102. For example, an analog-to-digital converter may in turn convert information about the galvanometers' position to a signal interpretable by the LIDAR control systems 110.

The LIDAR control systems 110 are further configured to analyze incoming digital signals. In this regard, the LIDAR apparatus 100 includes optical receivers 104 to measure one or more beams received by optical circuits 101. For example, a reference beam receiver may measure the amplitude of a reference beam from the active optical circuit, and an analog-to-digital converter converts signals from the reference receiver to signals interpretable by the LIDAR control systems 110. Target receivers measure the optical signal that carries information about the range and velocity of a target in the form of a beat frequency, modulated optical signal. The reflected beam may be mixed with a second signal from a local oscillator. The optical receivers 104 may include a high-speed analog-to-digital converter to convert signals from the target receiver to signals interpretable by the LIDAR control systems 110.

In some applications, the LIDAR apparatus 100 may additionally include one or more imaging devices 108 configured to capture images of the environment, a global positioning system 109 configured to provide a geographic location of the system, or other sensor inputs. The LIDAR apparatus 100 may also include an image processing system 114. The image processing system 114 can be configured to receive the images and geographic location, and send the images and location or information related thereto to the LIDAR control system 110 or other systems connected to the LIDAR apparatus 100.

In operation according to some examples, the LIDAR apparatus 100 is configured to use nondegenerate laser sources to simultaneously measure range and velocity across two dimensions. This capability allows for real-time, long range measurements of range, velocity, azimuth, and elevation of the surrounding environment. In some example implementations, the system points multiple modulated laser beams to the same target.

In some examples, the scanning process begins with the optical drivers 103 and LIDAR control system 110. The LIDAR control system 110 instructs the optical drivers 103 to independently modulate one or more lasers, and these modulated signals propagate through the passive optical circuit to the collimator. The collimator directs the light at the optical scanning system that scans the environment over a preprogrammed pattern defined by the motion control subsystem. The optical circuits also include a quarter-wave plate to transform the polarization of the light as it leaves the optical circuits 101. A portion of the polarized light may also be reflected back to the optical circuits 101. For example lensing or collimating systems may have natural reflective properties or a reflective coating to reflect a portion of the light back to the optical circuits 101.

Optical signals reflected back from the environment pass through the optical circuits 101 to the receivers. Because the light is polarized, it may be reflected by a polarization beam splitter along with the portion of polarized light that was reflected back to the optical circuits 101. Accordingly, rather than returning to the same fiber or waveguide as an optical source, the reflected light is reflected to separate optical receivers. These signals interfere with one another and generate a combined signal. Each beam signal that returns from the target produces a time-shifted waveform. The temporal phase difference between the two waveforms generates a beat frequency measured on the optical receivers (photodetectors). The combined signal can then be reflected to the optical receivers 104. Configuration of optical circuits 101 for polarizing and directing beams to the optical receivers 104 are described further below.

The analog signals from the optical receivers 104 are converted to digital signals using ADCs. The digital signals are then sent to the LIDAR control systems 110. A signal processing unit 112 may then receive the digital signals and interpret them. In some embodiments, the signal processing unit 112 also receives position data from the motion control system 105 and galvanometer as well as image data from the image processing system 114. The signal processing unit 112 can then generate a 3D point cloud with information about range and velocity of points in the environment as the optical scanner 102 scans additional points. The signal processing unit 112 can also overlay a 3D point cloud data with the image data to determine velocity and distance of objects in the surrounding area. The system also processes the satellite-based navigation location data to provide a precise global location.

Figure 2:
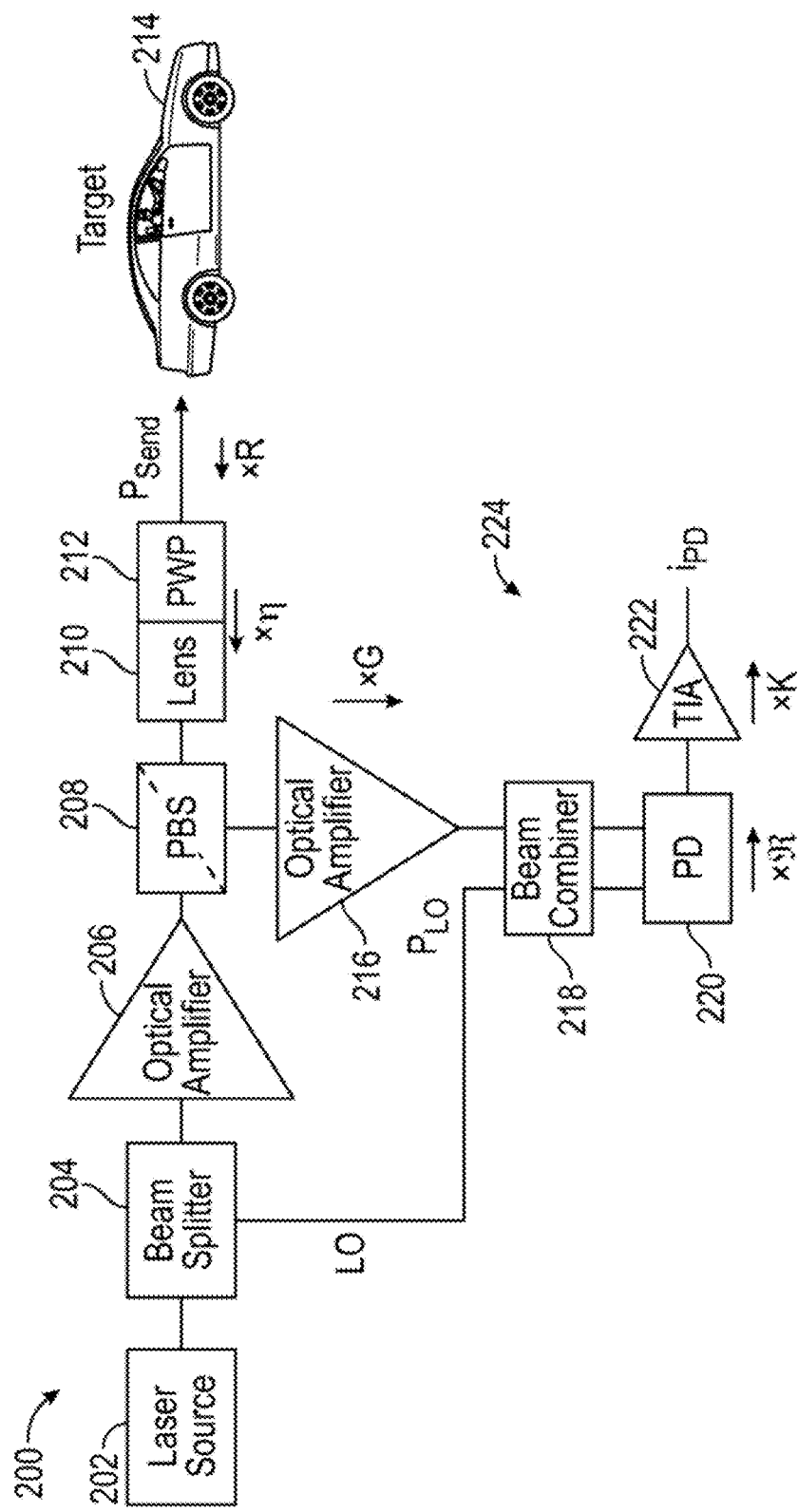
FIG. 2 illustrates aspects of the optical circuits of the LIDAR apparatus of FIG. 1 in accordance with an embodiment of the present disclosure.

FIG. 2 illustrates aspects of the optical circuits of the LIDAR apparatus of FIG. 1 in accordance with an embodiment of the present disclosure. An optical circuit, such as an optical circuit 200 shown in FIG. 2, can be part of optical circuits 101 shown in FIG. 1. The optical circuit 200 in FIG. 2 is shown as a side-view of a beam delivery system. Optical circuit 200 includes a laser source 202 configured to emit a laser beam, a beam separator (e.g., a beam splitter as shown) 204 operatively coupled (for example, optically coupled) to laser source 202, and a beam separator 208 configured to separate the laser beam propagated towards a target 214. Optical circuit 200 further includes a first optical amplifier 216 operatively coupled to beam separator (e.g., a polarization beam splitter as shown) 208, first optical amplifier 216 configured to receive a return laser beam reflected from target 214 in a return path and amplify the return laser beam to output an amplified return laser beam, and an optical component 224 operatively coupled to first optical amplifier 216. Optical component 224 is configured to output a current $i_{PD}$ based on the amplified return laser beam. Laser source 202 may suitably include a frequency modulated (FM) laser. Laser source 202 may emit one or more lasers with different wavelengths and may suitably include a single-mode or a multimode optical fiber.

Continuing with FIG. 2, optical circuit 200 further includes a beam splitter 204, a second optical amplifier 206, a lens 210 to collimate the light, and a polarization wave plate (PWP) 212 all in the transmission or sending path of the laser beam. In one embodiment, polarization wave plate 212 may be a quarter-wave plate. A quarter-wave plate may transform the polarization to a circular polarization state. In another embodiment, polarization wave plate 212 may be a half-wave plate. A half-wave plate may shift the polarization direction of linearly polarized light. Beam splitter 204 may suitably include a tap fiber optic beam splitter in one embodiment. Beam separator 208, lens 210, and PWP 212 may suitably form a collimation optics. Second optical amplifier 206 is in a transmission path of the laser beam propagated towards target 214 and second optical amplifier 206 is operatively coupled between laser source 202 and beam separator 208. Beam splitter 204 is operatively coupled between laser source 202 and first optical amplifier 216, and beam splitter 204 is configured to output a local oscillation signal (LO) received as an input to optical component 224. First optical amplifier 216 may be a semiconductor optical amplifier (SOA) in accordance with an aspect of the present disclosure. Alternatively, first optical amplifier 216 may be a fiber optical amplifier in accordance with another aspect of the present disclosure. Beam separator 208 may be a polarizing beam splitter (PBS) as shown in FIG. 2 in accordance with an aspect of the present disclosure. Alternatively, beam splitter 208 may be a circulator as shown in FIG. 3 in accordance with another aspect of the present disclosure.

Continuing with FIG. 2, optical component 224 includes a beam combiner 218 operatively coupled to an output of first optical amplifier 216, beam combiner 218 configured to receive a local oscillator signal (LO), and a photodetector 220 operatively coupled to beam combiner 218. Optical component 224 further includes an amplifier 222 operatively coupled to photodetector 220 in which amplifier 222 is configured to output the current $i_{PD}$. Beam combiner 218 may suitably include a 50/50 fiber optic beam combiner, and amplifier 222 may suitably include a transimpedance amplifier (TIA) in one embodiment. In one embodiment, beam combiner 218 can be omitted from the return path so that the local oscillator path can be extracted from the reflection at the lens system 210.

Figure 3:
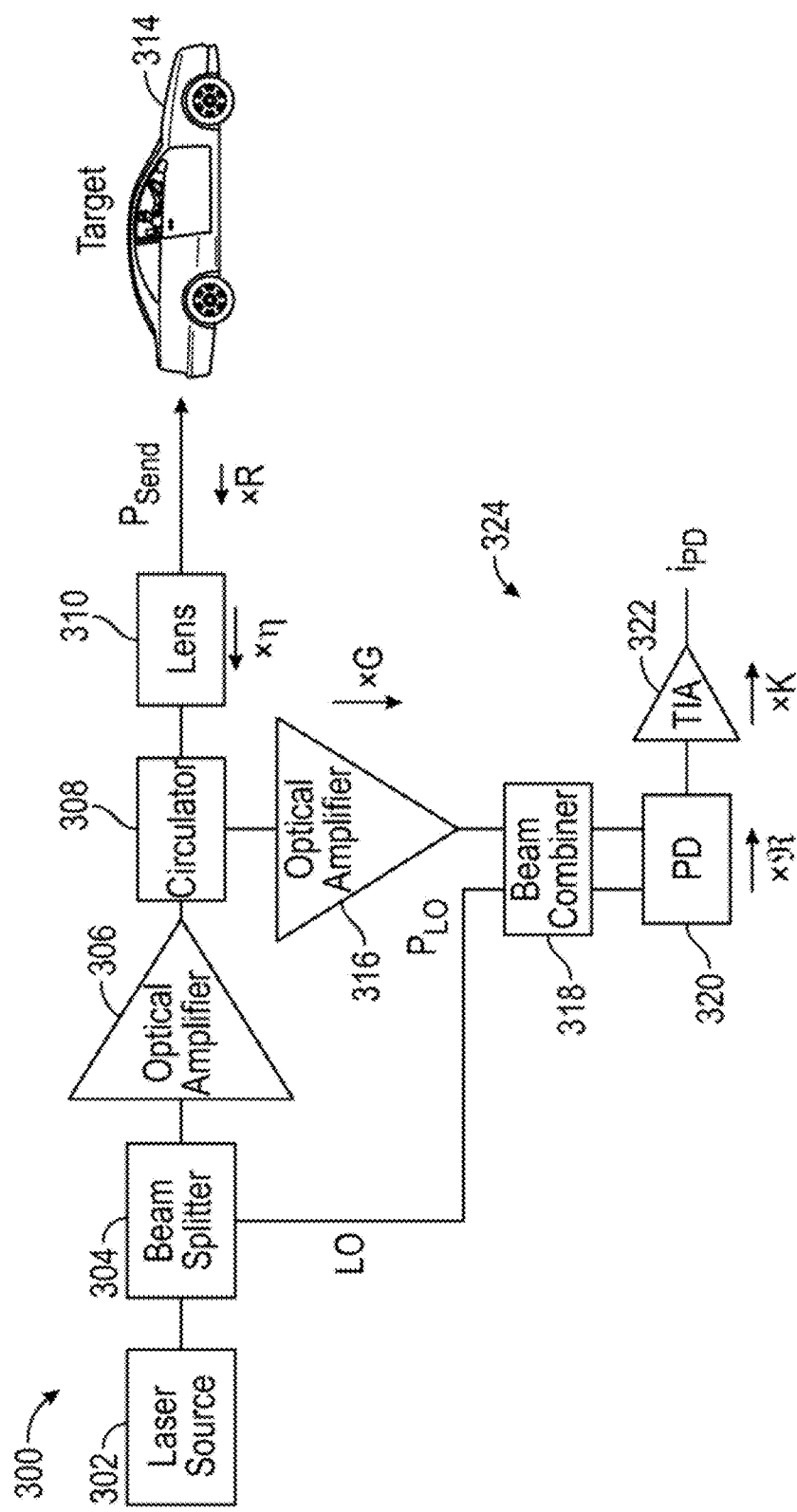
FIG. 3 illustrates aspects of the optical circuits of the LIDAR apparatus of FIG. 1 in accordance with an another embodiment of the present disclosure.

FIG. 3 illustrates aspects of the optical circuits of the LIDAR apparatus of FIG. 1 in accordance with another embodiment of the present disclosure. An optical circuit, such as an optical circuit 300 shown in FIG. 3, can be part of optical circuits 101 shown in FIG. 1. Optical circuit 300 includes a laser source 302, a beam splitter 304, an optical amplifier 306, a beam separator 308 which in the embodiment shown is a circulator, a lens 310, a target 314, an optical amplifier 316, and an optical component 324. The optical component 324 includes a beam splitter 318, a photodetector 320, and an amplifier 322 for outputting current $i_{PD}$. The embodiment shown in FIG. 3 differs from the embodiment shown in FIG. 2 in that in FIG. 3, circulator 308 is used instead of a polarizing beam splitter and a polarization wave plate is not used in conjunction with lens 310 to send laser beam $P_{send}$ to target 314. Otherwise, the embodiment shown in FIG. 3 is generally the same as the embodiment shown in FIG. 2.

Continuing again with FIG. 2, laser source 202 emits a laser beam which, after undergoing processing via beam splitter 204, second optical amplifier 206, beam separator 208, lens 210, and PWP 212, heads toward a target such as target 214. The laser beam is reflected by the target and is received in the return path ("collection path") as shown in FIG. 2. An optical amplifier (OA), such as first optical amplifier 216, amplifies the received photons ("reflected/returned laser beam") from a target, such as target 214, through stimulated emission. The duplicate photons generated by the OA have the identical phase as the photons received from the target. To quantitatively study the impact of gain mathematical equations that represent a linear frequency ramp in a FMCW LIDAR system may be utilized. The normalized electric field of optical power that is sent out by a FMCW LIDAR system is given by:

$$e_{send}(t) = A_{send}\cos\left(\omega_0 t + \gamma\frac{t^2}{2} + \phi_0\right)$$

Where $A_{send}$ is the electric field amplitude of the power that leaves the LIDAR, $\gamma$ is the slope of frequency modulation, $\omega_0$ is the carrier frequency and $\phi_0$ is the constant initial phase. The reflected power from the target that is collected by the lens system and is amplified by the OA is given by:

$$e_{target}(t) = \sqrt{GR\eta} \times E_{Send}(t-\tau)$$

where R is the reflectivity of the object ("target"), t is the collection efficiency (determined by the lens system), and G is the OA gain.

A FMCW LIDAR system mixes the received power from the target with the local oscillator power (LO) that has an electric field of:

$$e_{LO}(t) = A_{LO}\cos\left(\omega_0 t + \gamma\frac{t^2}{2} + \phi_1\right)$$

in which $A_{LO}$ is the amplitude of LO optical power. In this case the normalized photocurrent due to mixing at photodetector (PD) is given by:

$$i_{PD}(t) = K \times \mathcal{R} \times \langle |e_{LO}(t) + e_{Target}(t)|^2 \rangle \quad (e1)$$

$$i_{PD}(t) = K \times \mathcal{R} \times \left[ \frac{P_{LO} + GR\eta P_{Send} + P_{ASE}}{2} + A_{LO} \times \sqrt{GR\eta}\, A_{send}\cos\left(\omega_0\tau + \gamma\tau t - \gamma\frac{\tau^2}{2}\right) \right]$$

where K and $\mathcal{R}$ are the gain and responsivity of the PD respectively. Here $P_{ASE}$ is the amplified spontaneous emission power of the OA. In Equation 1 (e1), the oscillating term $$\left[ \sqrt{GR\eta}\, A_{send}\cos\left(\omega_0\tau + \gamma\tau t - \gamma\frac{\tau^2}{2}\right) \right]$$

is the RF signal and the DC term $$\left[ \frac{P_{LO} + GR\eta P_{Send} + P_{ASE}}{2} \right]$$

determines the shot noise. In one aspect, the LIDAR system is operated at the shot noise limited region in order to achieve the maximum SNR. In this case the SNR can be calculated using time averaged signal:

$$SNR = \frac{\langle i_s^2(t) \rangle}{\langle i_{shot}^2(t) \rangle} = \quad e2$$

$$\frac{K^2 + \mathcal{R}^2 \times \langle |A_{LO} \times \sqrt{GR\eta}\, A_{send}\cos(\omega_0\tau + \gamma\tau t - \gamma\tau^2/2)|^2 \rangle}{2qi_{PD}BW}$$

$$SNR = \frac{K \times \mathcal{R} \times (P_{LO} \times GR\eta P_{Send})}{q \times (P_{LO} \times GR\eta P_{Send} + P_{ASE}) \times BW}$$

where q is elementary charge and BW is the detection bandwidth. For LIDAR systems, the received signal power is much smaller than the LO and ASE powers (i.e. $P_{LO}$ and $P_{ASE} > P_{Send}$). The SNR gain using the OA is approximately calculated by:

$$\frac{SNR_{OA}}{SNR_{noOA}} \cong \frac{P_{LO}}{P_{LO} + P_{ASE}} \times G \quad e3$$

Therefore, as shown in Equation 3 (e3), the SNR of a FMCW LIDAR system using the OA can be improved when $P_{LO}$ is comparable to $P_{ASE}$. For instance, for a commercial FMCW laser where $P_{LO} \sim P_{ASE}$ and each power level is approximately 1 mW and OA gain G can be up to 20 dB, a SNR gain of 17 dB may be achieved.

Note that Equation 2 (e2) indicates that the SNR can also be improved by increasing the TIA gain (K), responsivity of PD ($\mathcal{R}$), collection efficiency ($\eta$), or send optical power ($P_{Send}$), as well as by decreasing the detection bandwidth (BW) (i.e increasing the detection average time). Nevertheless, there is a limit for increasing the TIA gain while achieving desired dynamic range and bandwidth. Responsivity of the detector can also be increased using avalanche photodiodes (APDs) in accordance with an aspect of the present disclosure. Collection efficiency can be increased by enlargement of the collection aperture; however, it is preferred to keep LIDAR systems compact. Sent optical power should remain below a certain power in order to guarantee requirements for eye safety. Bandwidth of detection generally cannot be decreased, as it will increase the system latency and slow down the sensor reaction. In one embodiment, optical circuits 200 and 300 shown in FIGS. 2 and 3, respectively, may each be included in a photonics chip or integrated circuit.

Figure 4:
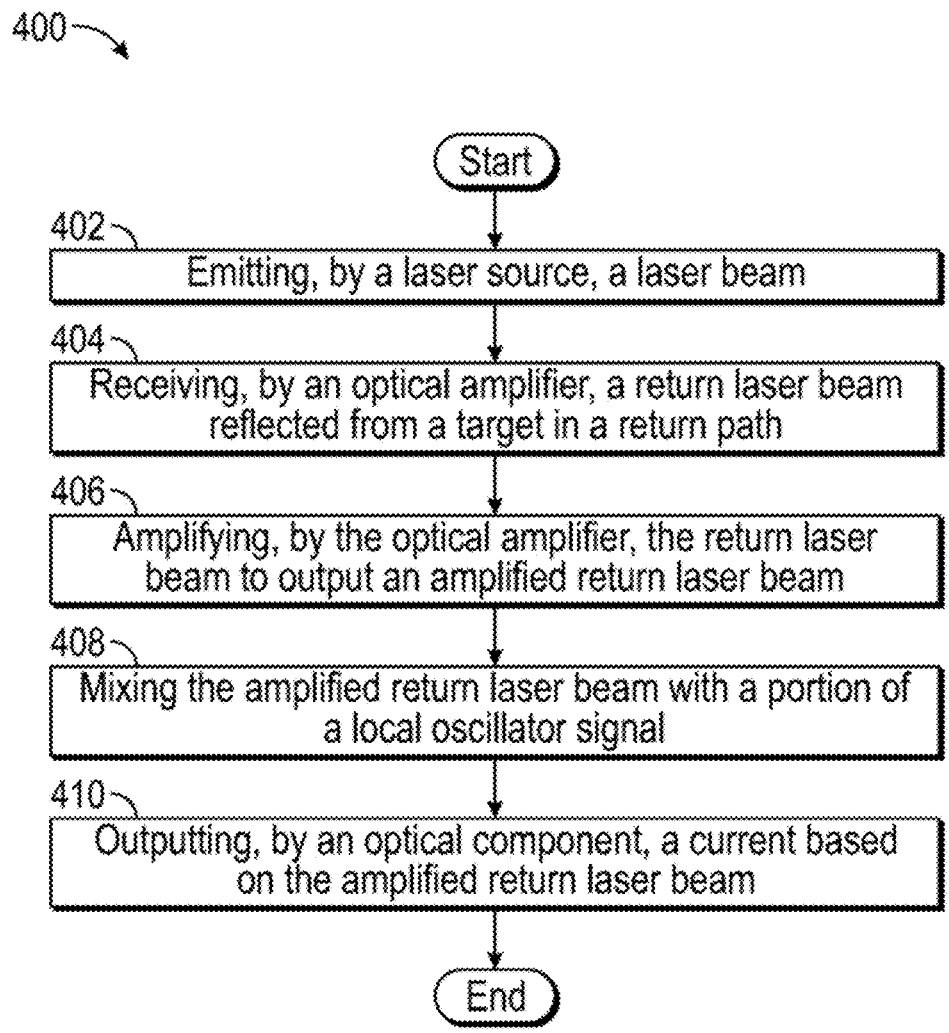
FIG. 4 is a flow diagram of a method of operating a LIDAR apparatus in accordance with an aspect of the present disclosure.

FIG. 4 illustrates an example flow diagram of a method 400 for operating a LIDAR apparatus, according to some aspects of the disclosure. In some embodiments, the flow diagram 400 may be performed by one or more components of the systems and apparatuses described with reference to FIGS. 1-3 above.

With reference to FIG. 4, method 400 illustrates example functions used by various embodiments. Although specific function blocks ("blocks") are disclosed in method 400, such blocks are examples. That is, embodiments are well suited to performing various other blocks or variations of the blocks recited in method 400. It is appreciated that the blocks in method 400 may be performed in an order different than presented, and that not all of the blocks in method 400 may be performed. Flow diagram 400 includes emitting, by a laser source, a laser beam at block 402. The flow diagram 400 further includes at block 404, receiving, by an optical amplifier, a return laser beam reflected from a target in a return path (reflected laser beam from the target) and at block 406, amplifying, by the optical amplifier, the return laser beam to output an amplified return laser beam. The flow diagram 400 further includes at block 408, mixing the amplified return laser beam with a portion of a local oscillator signal and at block 410, an optical component outputs a current based on the amplified return laser beam. In embodiments, flow diagram 400 may further include processing, by the optical component, a local oscillator signal with the amplified return laser beam to output the current and amplifying, by another optical amplifier, the laser beam before separating the laser beam propagated towards the target.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular embodiments may vary from these exemplary details and still be contemplated to be within the scope of the present disclosure.

Reference throughout this specification to "one embodiment" or "an embodiment" means that a particular feature, structure, or characteristic described in connection with the embodiments included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc. as used herein are meant as labels to distinguish among different elements and may not necessarily have an ordinal meaning according to their numerical designation.

What is claimed is:

1. A light detection and ranging (LIDAR) apparatus, comprising:
an optical circuit comprising:
a laser source configured to emit a laser beam;
a beam separator operatively coupled to the laser source, the beam separator configured to separate the laser beam into a local oscillator and a transmission beam propagated towards a target;
a first optical amplifier operatively coupled to the beam separator, the first optical amplifier configured to:
receive a return laser beam reflected from the target in a return path; and
amplify the return laser beam to output an amplified return laser beam, wherein a power level of the local oscillator is comparable to a power of amplified spontaneous emission of the first optical amplifier; and
an optical detector operatively coupled to the first optical amplifier, the optical detector configured to output a current based on the amplified return laser beam and the local oscillator.

2. The LIDAR apparatus of claim 1, wherein the first optical amplifier comprises a semiconductor optical amplifier.

3. The LIDAR apparatus of claim 1, the optical detector comprising:
a beam combiner operatively coupled to an output of the first optical amplifier, the beam combiner configured to receive a local oscillator signal;
a photodetector operatively coupled to the beam combiner; and
an amplifier operatively coupled to the photodetector, the amplifier configured to output the current.

4. The LIDAR apparatus of claim 1, wherein the beam separator comprises a polarizing beam splitter, the LIDAR apparatus further comprising an optical amplifier positioned after the polarizing beam splitter.

5. The LIDAR apparatus of claim 1, wherein the beam separator comprises a circulator.

6. The LIDAR apparatus of claim 1, the optical circuit comprising a second optical amplifier in a transmission path of the laser beam propagated towards the target, the second optical amplifier operatively coupled between the laser source and the beam separator.

7. The LIDAR apparatus of claim 1, the optical circuit comprising a beam splitter operatively coupled between the laser source and the first optical amplifier, the beam splitter configured to output a local oscillation signal received as an input to the optical detector.

8. The LIDAR apparatus of claim 1, wherein the optical circuit is included in a photonics chip.

9. An optical circuit for a light detection and ranging (LIDAR) apparatus, the optical circuit comprising:
a laser source configured to emit a laser beam propagated towards a target;
a beam separator operatively coupled to the laser source, the beam separator to separate the laser beam into a local oscillator signal and a transmission beam propagated towards a target
a first optical amplifier operatively coupled to the laser source, the first optical amplifier configured to:
receive a return laser beam reflected from the target in a return path; and
amplify the return laser beam to output an amplified return laser beam, wherein a power level of the local oscillator signal is comparable to a power of amplified spontaneous emission of the first optical amplifier; and
an optical detector operatively coupled to the first optical amplifier, the optical detector configured to output a current based on the amplified return laser beam and the local oscillator signal.

10. The optical circuit of claim 9, wherein the first optical amplifier comprises a semiconductor optical amplifier.

11. The optical circuit of claim 9, wherein the optical detector comprises:

a beam combiner operatively coupled to an output of the first optical amplifier, the beam combiner configured to receive the local oscillator signal;

a photodetector operatively coupled to the beam combiner; and an amplifier operatively coupled to the photodetector, the amplifier configured to output the current.

12. The optical circuit of claim 9, wherein the beam separator comprises a polarizing beam splitter.

13. The optical circuit of claim 9, wherein the beam separator comprises a circulator.

14. The optical circuit of claim 9, further comprising:
a second optical amplifier in a transmission path of the transmission beam propagated towards the target, the second optical amplifier operatively coupled between the laser source and the beam separator.

15. The optical circuit of claim 9, further comprising:
a beam splitter operatively coupled between the laser source and a second optical amplifier, the beam splitter configured to separate a first portion of the laser beam propagated towards the target and a second portion of the laser beam as the local oscillator signal received at the optical detector.

16. A method comprising:
emitting, by a laser source, a laser beam;
separating, by a beam separator, the laser beam into a local oscillator signal and a transmission beam propagated towards a target;
receiving, by an optical amplifier, a return laser beam reflected from a target in a return path;
amplifying, by the optical amplifier, the return laser beam to output an amplified return laser beam, wherein a power level of the local oscillator signal is comparable to a power of amplified spontaneous emission of the optical amplifier;
mixing the amplified return laser beam with a portion of a local oscillator signal; and
outputting, by an optical detector, a current based on the amplified return laser beam and the local oscillator signal.

17. The method of claim 16, further comprising:
processing, by the optical detector, a local oscillator signal with the amplified return laser beam to output the current.

18. The method of claim 16, further comprising:
amplifying, by another optical amplifier, the laser beam, wherein separating the laser beam propagated towards the target is in response to amplifying the laser beam by the another optical amplifier.

19. The method of claim 16, wherein the optical amplifier comprises a semiconductor optical amplifier.

20. The method of claim 16, wherein the optical amplifier comprises a fiber optical amplifier.

21. The method of claim 16, wherein the beam separator comprises a polarizing beam splitter.

* * * * *